(12) United States Patent
Yan

(10) Patent No.: US 6,830,851 B2
(45) Date of Patent: Dec. 14, 2004

(54) PHOTOLITHOGRAPHIC MASK FABRICATION

(75) Inventor: Pei-Yang Yan, Saratoga, CA (US)

(73) Assignee: Intel Corporation, Santa Clara, CA (US)

(*) Notice: Subject to any disclaimer, the term of this patent is extended or adjusted under 35 U.S.C. 154(b) by 234 days.

(21) Appl. No.: 10/117,603

(22) Filed: Apr. 4, 2002

(65) Prior Publication Data

US 2003/0190532 A1 Oct. 9, 2003

Related U.S. Application Data

(63) Continuation-in-part of application No. 09/895,739, filed on Jun. 30, 2001, now Pat. No. 6,756,158.

(51) Int. Cl.[7] ................................................ G03F 9/00
(52) U.S. Cl. .......................................................... 430/5
(58) Field of Search ............................................ 430/5

(56) References Cited

U.S. PATENT DOCUMENTS 5,328,784 A    7/1994  Fukuda
5,503,950 A  * 4/1996  Miyake et al. ................. 430/5

OTHER PUBLICATIONS

Masaaki Ito et al., Optical Technology for EUV Lithography pp. 9–12, 1996, Central Research Laboratory, Hitachi, Ltd., Tokyo 185, Japan.

* cited by examiner

Primary Examiner—Saleha R. Mohamedulla
(74) Attorney, Agent, or Firm—Fish & Richardson P.C.

(57) ABSTRACT

A method of making a photolithographic mask includes forming a metal-silicon layer on a substrate, and processing at least a portion of the metal-silicon layer. The metal-silicon layer has a first thickness and the portions of the metal-silicon layer are processed to a second thickness that is less than the first thickness. The method also includes forming a reflector layer on the metal-silicon layer to produce a mask blank and then forming the mask from the mask blank. The mask blank includes the substrate, metal-silicon layer, and reflector layer.

36 Claims, 4 Drawing Sheets

PHOTOLITHOGRAPHIC MASK FABRICATION

CROSS REFERENCE TO RELATED APPLICATION

This application is a continuation-in-part of and claims priority to U.S. application Ser. No. 09/895,7397 filed on Jun. 30, 2001 now U.S. Pat. No. 6,756,158.

TECHNICAL FIELD

This invention relates to fabrication of photolithographic masks for semiconductor processing.

BACKGROUND

Photolithography uses an imaging system that directs radiation onto a patterned mask to form an image that then is projected onto a semiconductor wafer covered with light-sensitive photoresist.

DESCRIPTION OF DRAWINGS

Like reference symbols in the various drawings indicate like elements.

DETAILED DESCRIPTION

Photolithography uses an imaging system that directs radiation onto a mask to form a pattern and then projects the image of that pattern with a reduction, for example, of 4:1, onto a semiconductor wafer covered with light-sensitive photoresist. The pattern is formed from absorptive features or lines etched into the mask, as discussed below. The radiation used in photolithography may be at any suitable wavelength, with the resolution of the system increasing with decreasing wavelength. The ability to print smaller features onto the semiconductor wafer improves as the resolution increases.

One type of photolithography system uses radiation in the extreme ultraviolet (EUV) wavelength range. In general, EUV radiation has wavelengths in the range of 1 to 40 nanometers (nm), and the EUV radiation used in photolithography has wavelengths in the range of 10 to 15 nm. Photolithography carried out with radiation in this region has come to be known as EUV lithography (EUVL).

Figure 1:
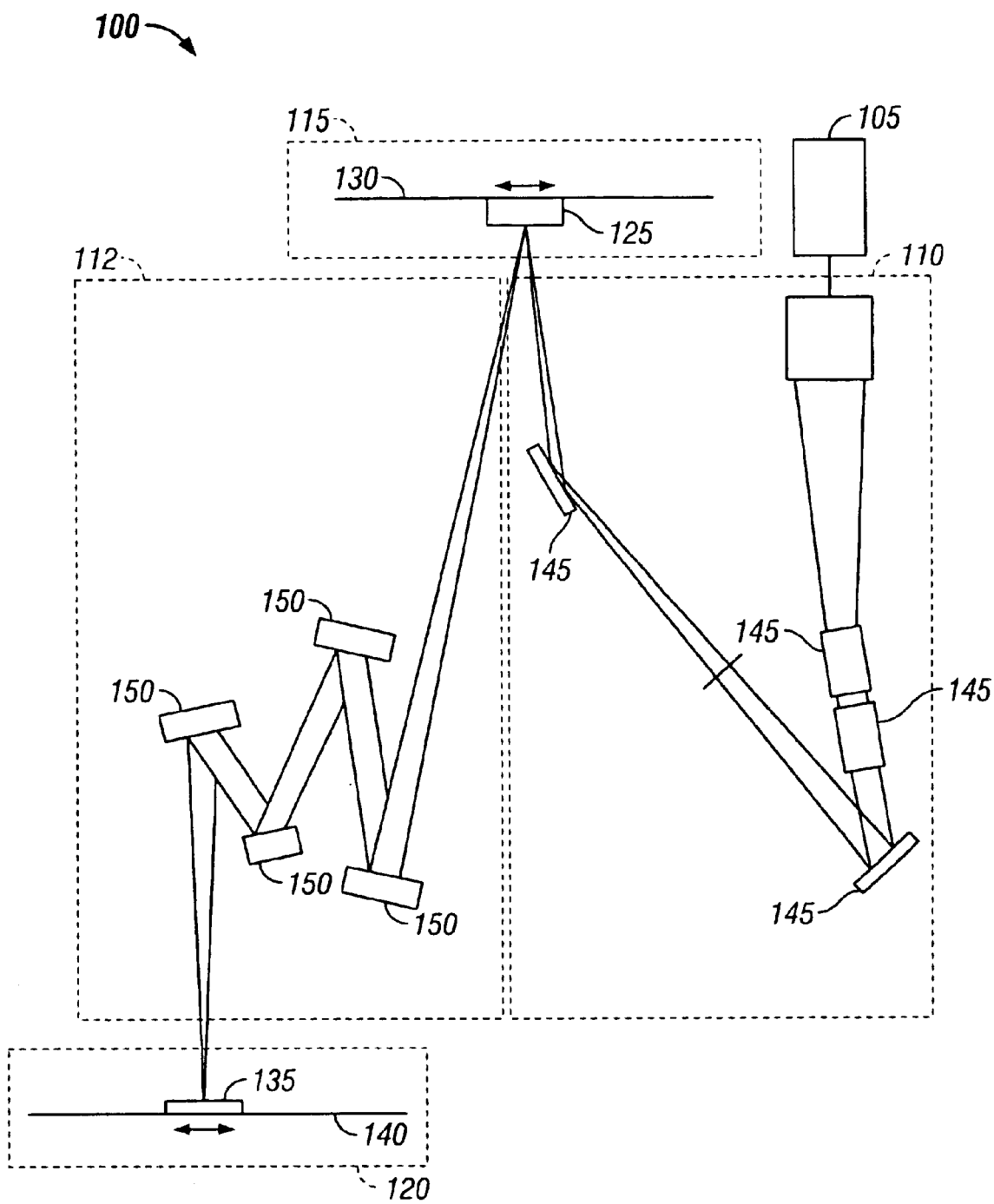
FIG. 1 is a block diagram of a photolithography imaging system that uses a mask in processing a wafer.

Referring to FIG. 1, an EUVL imaging system 100 includes a radiation source 105, a condenser optics section 110, a projection optics section 112, a mask stage 115, and a wafer stage 120. For ease of discussion, the described implementations relate to EUVL imaging systems. However, the methods and systems described are not limited to EUVL imaging systems. Rather, they may be used in any photolithography imaging system that uses a mask. The mask may be a reflective mask or a transmissive mask.

The radiation source 105 may be any source able to produce radiation in the extreme ultraviolet (EUV) wavelength range. One example of a suitable radiation source 105 is a plasma created when a laser, such as a 1700 Watt (W) pulsed ytterbium-aluminum-garnet (YAG) solid-state laser, illuminates a gas, such as a supersonic jet of xenon gas. As another example, a suitable radiation source 105 may be formed using bending magnets and undulators associated with synchrotrons. As a further example, a suitable radiation source 105 may be formed or developed from discharge sources, which have the potential to provide adequate power in the desired wavelength range. EUV radiation is absorbed in many materials, including some gases and glass. For this reason, EUV imaging is carried out in an atmosphere in which the EUV radiation is not absorbed, such as, for example, a near vacuum atmosphere, or an argon atmosphere.

The mask stage 115 includes a mask 125 mounted to a transport stage 130 that scans the mask 125. The mask 125 may be planar, concave, convex, or of any shape suitable for patterning. In an EUVL imaging system, the mask 125 is reflective because EUV radiation is absorbed in many materials such as quartz, which is often used in traditional transmissive photolithography imaging systems.

The wafer stage 120 includes a semiconductor wafer 135 mounted to a transport stage 140 that scans the wafer 135 in synchrony with the mask 125 and steps the wafer 135 into a position to accept a next image from the mask 125.

The condenser optics section 110 brings the radiation from the source 105 to the mask stage 115. In an EUVL imaging system, the condenser optics are reflective because many materials are absorptive of EUV radiation. Accordingly, the condenser optics section 110 includes condenser reflectors or mirrors 145 that collect and focus the radiation from the source 105 onto the mask stage 115. Any number of condenser mirrors 145 may be used, such as, for example, the four shown in FIG. 1.

The projection optics section 112 reduces the image from the mask 125 in the mask stage 115 and forms the image onto wafer 135 in the wafer stage 120. In an EUVL imaging system, the projection optics are reflective because EUV radiation is absorbed in many materials used in traditional transmissive photolithography imaging systems. Accordingly, the projection optics section 112 includes reflectors or mirrors 150 that project radiation reflected from the mask 125 onto the wafer. The reflectance spectrum of the mask 125 is matched to that of the mirrors in the projection optics section 112.

Generally, the mask 125 is formed of a patterned absorber made from an absorber layer to absorb radiation, a buffer layer, a reflector layer, and an underlying substrate. Often, phase error is induced at a boundary between the reflector layer and the absorber layer. Such a phase error may be caused by the interaction of the radiation reflected from the reflector layer and the radiation scattered at the boundary between the absorber layer and the reflector layer. The induced phase error reduces resolution and the depth of focus, which narrows the process window, which is a range of focus and exposure dose of the imaging system that produces an adequate or useful semiconductor wafer.

Referring also to FIGS. 2A–2G and 3, a mask 225 may be fabricated using a procedure 300 that provides a phase shift in the fabricated mask 225 and avoids a removal step before mask blank processing to avoid mask defects that occur when material is removed during processing. The mask 225 is formed from an absorber layer 230 that absorbs EUV radiation, a buffer layer 235, a metal-silicon layer 245, a reflector layer 240, and an underlying substrate 250. In operation, any radiation incident on the mask 225 will be absorbed by a patterned absorber layer or partially reflected by the reflector layer 240 in a non-patterned region.

Figure 2A:
FIGS. 2A–2G are cross-sectional representations of a mask being fabricated using a fabrication process.
Figure 3:
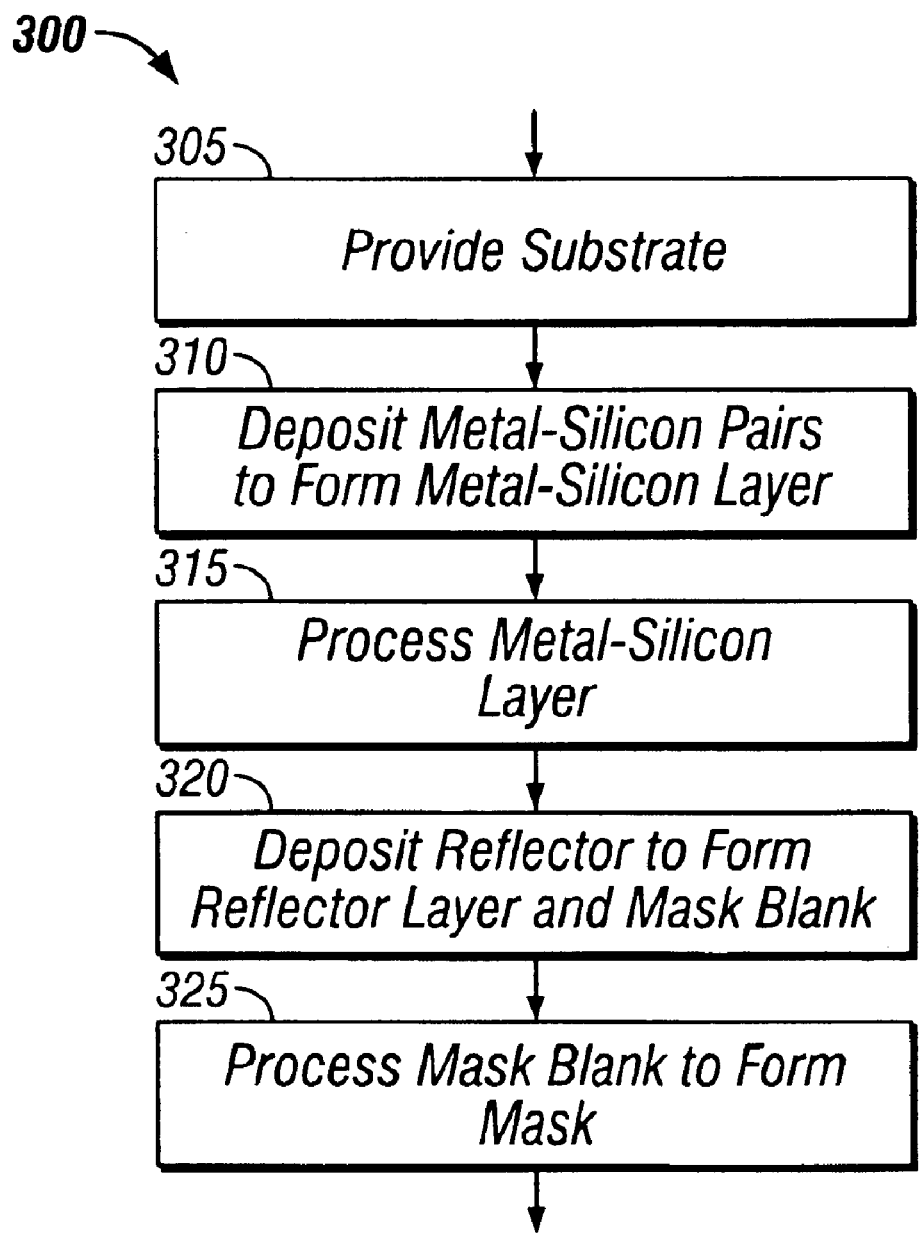
FIG. 3 is a flow chart of a procedure for fabricating the mask of FIG. 2G.

The procedure 300 illustrated in FIG. 3 begins as also shown in FIG. 2A, with the provision of the substrate 250 (305). As discussed, the substrate 250 may be fabricated from any substrate material that can handle subsequent fabrication processes and is typically made of a material having a low thermal expansion, such as, for example, ULE™. In one implementation, the substrate 250 is 0.64 cm thick.

Figure 2B:
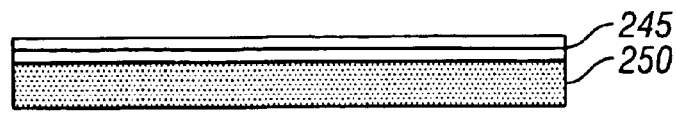
Figure 2C:
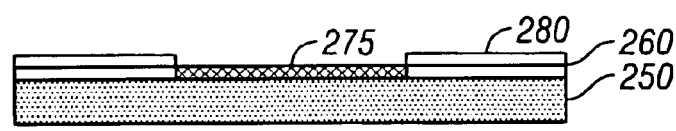
Figure 2D:
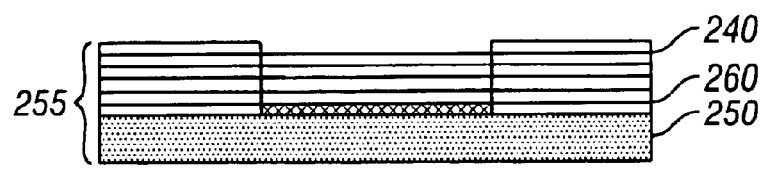

Then, as shown in FIG. 2B, the metal-silicon layer 245 is formed by depositing one or more pairs of metal and silicon (Si) on the substrate 250 (310). A number of different metals may be used. In one implementation, the metal is molybdenum (Mo). Other possible metals include nickel (Ni), titanium (Ti), cobalt (Co), platinum (Pt), and palladium (Pd).

In one implementation, the metal and silicon pairs may form a multilayer (ML) of metal and silicon, that is, multiple layers of metal and silicon.

In any case, the material and thickness of the metal-silicon layer 245 are chosen to provide a target phase shift in the mask 225 after further processing as detailed below.

The metal-silicon layer 245 is processed to create the target phase shift (315) by selectively changing the size of portions of the metal-silicon layer. In this way, a phase pattern 260 is formed of processed portions 275 and non-processed portions 280, which have a different thickness than thickness of the processed portions 275. For example, processing of the metal-silicon layer 245 may include shrinking the metal-silicon layer such that the thickness of the processed portions 275 is less than the thickness of the non-processed portions 280. Alternatively, processing of the metal-silicon layer 245 may include expanding the metal-silicon layer such that the thickness of the processed portions 275 is greater than the thickness of the non-processed portions 280.

In either case, the absolute difference in thickness (d) (called a target thickness) between the non-processed portions 280 and the processed portions 275 provides for the target phase shift ($\Delta\phi$) in the fabricated mask 225 and is given by the general expression:

$$\Delta\phi = \frac{4\pi}{\lambda} \times n \times \frac{d}{\cos\theta} \text{ (in radians)},$$

where n is the index of refraction of an atmosphere at which mask imaging occurs, $\lambda$ is the wavelength of the radiation directed onto the mask from the imaging system, and $\theta$ is the angle of incidence of the radiation onto the mask from the imaging system. If $\lambda$ equals 13.4 nm, $\theta$ equals 5°, and n equals 1, then the target thickness is about 3.45 nm if the target phase shift is 180°.

In one implementation, the metal-silicon layer 245 is selectively processed using a selective heating technique that converts the metal-silicon pairs in portions of the metal-silicon layer 245 to form metal silicide in the processed portions 275. The metal silicide takes up more or less volume than the volume filled by the metal-silicon pairs in that portion. The change in volume, (that is, the shrinkage or expansion), depends on the selection of the metal, the temperature at which the layer 245 is selectively heated, and the length of exposure to the heat. In general, the irradiation of the heat source causes a reaction in the metal-silicon pairs and the reaction forms a composition having the general formula metal$_x$Si$_y$ (metal silicide), in which x corresponds to a number of metal atoms and y corresponds to a number of Si atoms in the composition. The values of x and y depend on the type of metal, and the intensity of and the length of exposure to the heat source. If the metal is Mo, then molybdenum silicide will be formed.

The metal-silicon layer 245 may be selectively heated using a suitable heat source and writing method, such as an electron beam or a photon source (for example, a laser) direct write to define the phase pattern 260.

The intensity of the heat source is selected to generate enough heat to cause the reaction in the exposed portions of the metal-silicon layer 245, that is, to raise the temperature of the exposed portions of the metal-silicon layer 245 to above a predetermined temperature, to activate the reaction in the exposed portions of the metal-silicon layer 245. Depending on the temperature and the length of exposure at which the layer 245 is heated, the reaction may convert all of the metal or silicon in the metal-silicon pairs in the layer 245 into metal silicide (called a complete conversion) or the reaction may convert some of the metal or silicon in the metal-silicon pairs in the layer 245 into metal silicide (called a partial conversion).

For example, if the metal-silicon layer 245 is made of Mo—Si pairs, the intensity of the heat source may be selected to raise the temperature to above 200° C. to activate the reaction in the Mo—Si pairs exposed to the heat source.

In one implementation, the intensity of the heat source may be varied during exposure.

After the metal-silicon layer 245 is processed (315), the reflector layer 240 is formed by depositing reflector material on the processed metal-silicon layer (320). In this way, a mask blank 255 including the substrate 250, the pattern 260, and the reflector layer 240 is formed. The reflector material may be made of a multilayer (ML) consisting of multiple layers of material with alternating indexes of refraction to provide a resonant reflectivity when the period of the layers is approximately one half the wavelength of the radiation used in the imaging system. A number of different combinations of reflective and transmissive materials may be used. In one implementation, the materials are Mo and Si. The Mo/Si may be alternately layered at thicknesses of about 2 to 12 nm to create a second reflector layer thickness of about 50 to 500 nm.

Figure 2E:
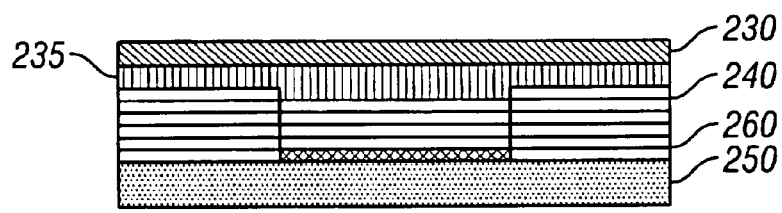
Figure 2F:
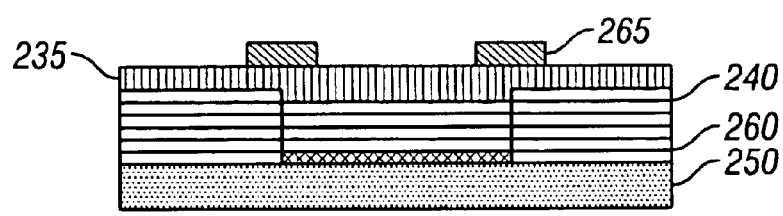
Figure 2G:
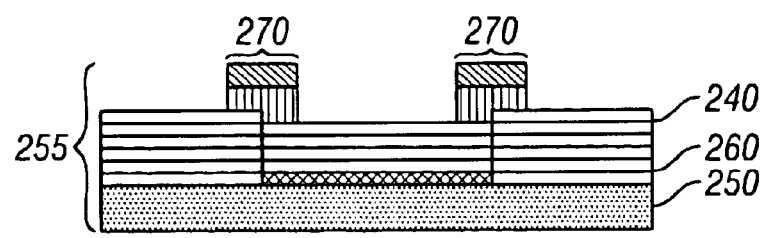
Figure 4:
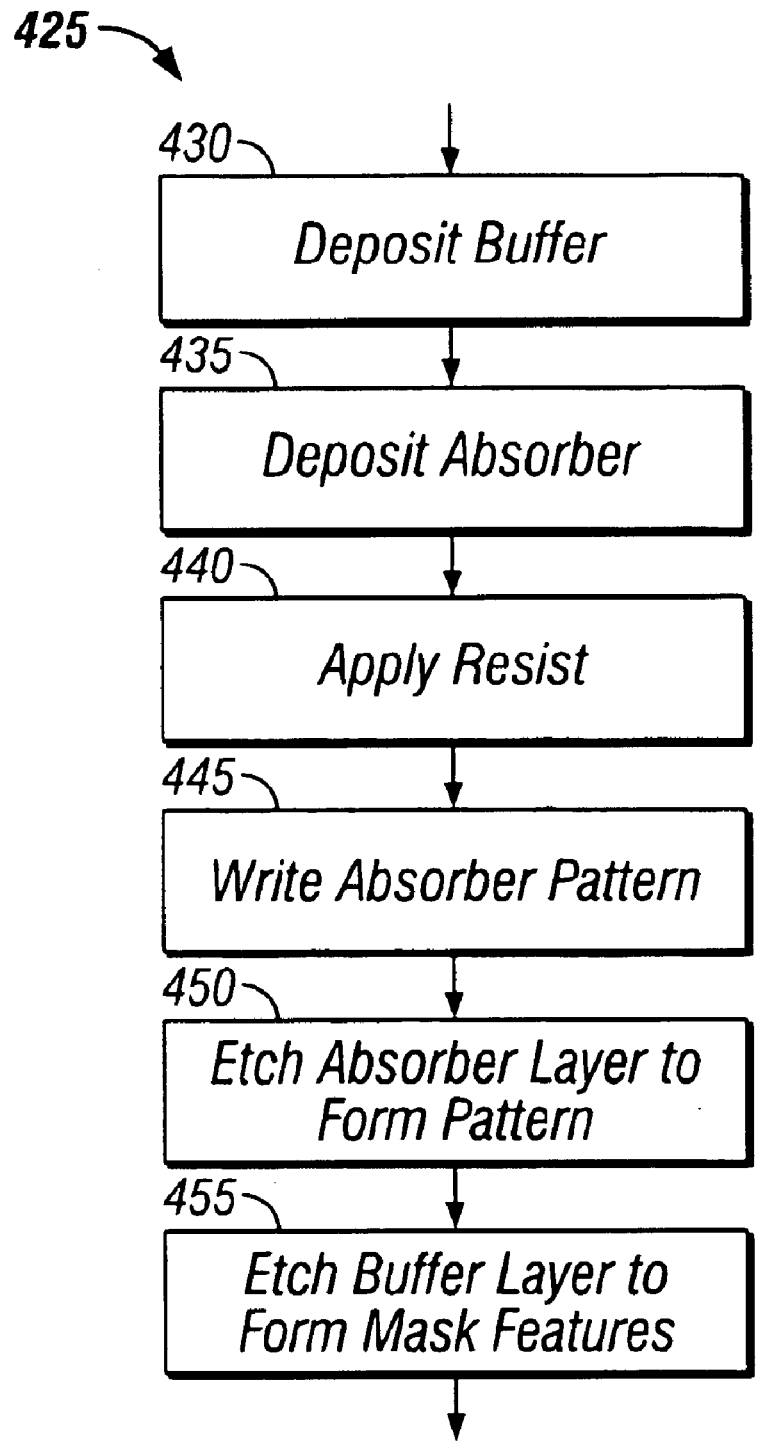
FIG. 4 is a flow chart for processing a mask blank formed during fabrication of a mask.

Next, as shown in FIGS. 2E–2G, the mask 225 is formed from the mask blank 255 using a suitable technique (325). Referring also to FIG. 4, for example, the mask 225 may be formed according to a procedure 425. First, as shown in FIG. 2E, the buffer layer 235 is formed by depositing buffer material on the reflector layer 240 (430). The buffer layer 235 may be made of any material that serves as a stop layer or an etch profile controller. The buffer layer 235 protects the underlying layer 240 during etching and repair while ensuring that etched patterns in the absorber layer are clean and substantially vertical. The buffer layer 235 is relatively non-opaque and should be easy to selectively remove or etch. The thickness of the buffer layer 235 is mostly determined by absorber etch selectivity to the buffer material, repair etch selectivity to the layer 240, and optical inspection contrast. In one implementation, the buffer layer 235 has a thickness ranging from 30 to 50 nm and is made of silicon dioxide (SiO$_2$). In other implementations, the buffer layer 235 may be made of carbon (C) or ruthenium (Ru). The buffer material may be deposited using any suitable technique, such as physical vapor deposition or sputtering. The technique is performed at a temperature selected to avoid modification to the underlying reflector layer 240.

Next, the absorber layer 230 is formed by depositing an absorber material on the buffer layer 235 (435). The absorber material may be deposited using any suitable technique, such as physical vapor deposition or sputtering.

The absorber layer 230 may be made of any suitable material that is absorptive of radiation at the wavelength used in the imaging system 100 and that can be selectively etched. The thickness of the absorber layer 230 is mostly determined by the radiation absorption of the material used as the absorber. The absorber layer 230 may be made of any material or composition that meets these criteria, such as, for example, chromium (Cr), tantalum (Ta), tantalum nitride (TaN), and tantalum boron nitride (TaBN). Typically, if TaN is used, the thickness of the absorber layer 530 may be in the range of 50 to 100 nm.

A photoresist is then applied to the absorber layer 230 (440) and patterned using stored pattern data (445). That pattern is then replicated into the absorber layer 230 by etching the absorber layer 230 in locations not covered by the photoresist to form an etched absorber pattern 265 (450), as shown in FIG. 2F. The photoresist then is selectively removed and the buffer layer 235 is etched in locations not covered by the etched absorber pattern to produce mask features 270 in the final mask 225 (455), as shown in FIG. 2G. The absorber layer 230 and the buffer layer 235 may be etched using any suitable etching techniques. The etched mask pattern ultimately is used to pattern the semiconductor wafer using the projection optics and the condenser optics, as discussed above. In one implementation, as discussed above, the mask may be etched using plasma etching.

Other implementations are within the scope of the following claims. For example, as discussed, the photolithography imaging system may use a transmissive mask. In this case, the mask includes a patterned absorber on a substrate that absorbs radiation at the wavelength at which the mask is patterned. The transmissive mask may include an imaging layer or a buffer layer on the substrate so that the absorber layer is not deposited directly on the substrate. During imaging, the image is projected onto the wafer.

In any case, the mask may be made with or without a buffer layer.

What is claimed is:

1. A method of making a photolithographic mask, the method comprising:
   forming a metal-silicon layer on a substrate, the metal-silicon layer having a first thickness;
   processing at least a portion of the metal-silicon layer to a second thickness that is different from the first thickness;
   forming a reflector layer on the processed metal-silicon layer to produce mask blank including the substrate, metal-silicon layer, and reflector layer; and
   forming the photolithographic mask from the mask blank.

2. The method of claim 1 in which forming the metal-silicon layer on the substrate comprises depositing one or more pairs of metal and silicon on the substrate.

3. The method of claim 1 in which processing the portion of he metal-silicon layer comprises applying heat to the portion of the metal-silicon layer to cause a metal silicide reaction in the portion of the metal-silicon layer.

4. The method of claim 1 in which processing the portion of the metal-silicon layer comprises raising the temperature of the portion of the metal-silicon layer to a temperature great enough to change a volume of the portion such that the processed portion has a second thickness that is different from the first thickness.

5. The method of claim 1 in which the second thickness is greater than the first thickness.

6. The method of claim 1 in which the second thickness is less than the first thickness.

7. The method of claim 1 in which the metal-silicon layer comprises a multilayer of molybdenum and silicon and processing the portion of the metal-silicon layer comprises raising the temperature of the portion to greater than 200° C.

8. The method of claim 1 in which processing the portion of the metal-silicon layer comprises applying an electron beam to the portion of the metal-silicon layer to cause a reaction in the portion of the metal-silicon layer.

9. The method of claim 1 in which processing the portion of the metal-silicon layer comprises applying a photonic beam to the portion of the metal-silicon layer to cause a reaction in the portion of the metal-silicon layer.

10. The method of claim 1 in which processing the portion of the metal-silicon layer comprises processing the portion such that an absolute difference between the first thickness and the second thickness is $$\Delta\phi \frac{\lambda\cos\theta}{4\pi n},$$

where $\lambda$ is a wavelength and $\theta$ is an angle of incidence of radiation directed onto the photolithographic mask from an imaging system during patterning of a semiconductor wafer, n is an index of refraction of an atmosphere at which imaging of the photolithographic mask occurs, and $\Delta\phi$ is a target phase shift.

11. The method of claim 1 in which forming the photolithographic mask comprises:
   forming a buffer layer on the mask blank;
   forming an absorber layer on the buffer layer; and
   selectively etching the absorber layer to form mask features.

12. A method of making a mask blank to be used in forming a photolithographic mask, the method comprising:
   forming a metal-silicon layer on a substrate, the metal-silicon layer having a first thickness;
   processing at least a portion of the metal-silicon layer to a second thickness that is different from the first thickness; and
   forming a reflector layer on the processed metal-silicon layer to produce the mask blank including the substrate, metal-silicon layer, and reflector layer.

13. The method of claim 12 in which forming the metal-silicon layer on the substrate comprises depositing one or more pairs of metal and silicon material on the substrate.

14. The method of claim 12 in which processing the portion of the metal-silicon layer comprises applying heat to the portion of the metal-silicon layer to cause a reaction in the portion of the metal-silicon layer.

15. The method of claim 12 in which processing the portion of the metal-silicon layer comprises raising the temperature of the portion of the metal-silicon layer to a temperature great enough to change a volume of the portion such that the processed portion has a second thickness that is different from the first thickness.

16. The method of claim 12 in which the second thickness is greater than the first thickness.

17. The method of claim 12 in which the second thickness is less than the first thickness.

18. The method of claim 12 in which the metal-silicon layer comprises pairs of molybdenum and silicon and processing the portion of the metal-silicon layer comprises raising the temperature of the portion to greater than 200° C.

19. The method of claim 12 in which processing the portion of the metal-silicon layer comprises applying an electron beam to the portion of the metal-silicon layer to cause a reaction in the portion of the metal-silicon layer.

20. The method of claim 12 in which processing the portion of the metal-silicon layer comprises applying a photonic beam to the portion of the metal-silicon layer to cause a reaction in the portion of the metal-silicon layer.

21. The method of claim 12 in which processing the portion of the metal-silicon layer comprises processing the portion such that an absolute difference between the first thickness and the second thickness is $$\Delta\phi \frac{\lambda \cos\theta}{4\pi n}$$

where $\lambda$ is a wavelength and $\theta$ is an angle of incidence of radiation directed onto the photolithographic mask from an imaging system during patterning of a semiconductor wafer, n is an index of refraction of an atmosphere at which imaging of the photolithographic mask occurs, and $\Delta\phi$ is a target phase shift.

22. A mask blank to be used in forming a photolithographic mask, the mask blank comprising:
   a metal-silicon layer formed on a substrate, the metal-silicon layer having a first thickness, the metal-silicon layer comprising at least a portion processed to a second thickness that is different from the first thickness; and
   a reflector layer formed on the processed metal-silicon layer to produce the mask blank including the substrate, metal-silicon layer, and reflector layer.

23. The mask blank of claim 22 in which the processed portion is formed by applying heat to the portion of the metal-silicon layer.

24. The mask blank of claim 22 in which the processed portion is formed by raising the temperature of the portion of the metal-silicon layer to a temperature great enough to change a volume of the portion such that the processed portion has a second thickness that is different from the first thickness.

25. The mask blank of claim 22 in which the metal-silicon layer comprises one or more pairs of molybdenum and silicon.

26. The mask blank of claim 22 in which an absolute difference between the first thickness and the second thickness is $$\Delta\phi \frac{\lambda \cos\theta}{4\pi n}$$

where $\lambda$ is a wavelength and $\theta$ is an angle of incidence of radiation directed onto the photolithographic mask from an imaging system during patterning of a semiconductor wafer, n is an index of refraction of an atmosphere at which imaging of the photolithographic mask occurs, and $\Delta\phi$ is a target phase shift.

27. The mask blank of claim 22 in which the metal in the metal-silicon layer comprises an element from the group of molybdenum, nickel, titanium, cobalt, platinum, and palladium.

28. The method of claim 1 in which processing includes processing all of the metal and silicon in the portion into metal silicide.

29. The method of claim 1 in which processing includes processing only some of the metal and silicon in the portion into metal silicide.

30. The method of claim 1 in which forming the reflector layer includes forming the reflector layer on the processed metal-silicon layer portion.

31. The method of claim 12 in which processing includes processing all of the metal and silicon in the portion into metal silicide.

32. The method of claim 12 in which processing includes processing only some of the metal and silicon in the portion into metal silicide.

33. The method of claim 12 in which forming the reflector layer includes forming the reflector layer on the processed metal-silicon layer portion.

34. The mask blank of claim 22 in which the portion processed to a second thickness is formed entirely of metal silicide.

35. The mask blank of claim 22 in which the portion processed to a second thickness is formed partially of metal silicide.

36. The mask blank of claim 22 in which the reflector layer is formed on the processed metal-silicon layer portion.

* * * * *